United States Patent
Chen et al.

(10) Patent No.: US 8,001,684 B2
(45) Date of Patent: Aug. 23, 2011

(54) METHOD FOR MANUFACTURING FLEXIBLE PRINTED CIRCUIT BOARDS

(75) Inventors: Chia-Cheng Chen, Taoyuan (TW); Chao-Ching Wang, Taoyuan (TW); Chiang-Hua Huang, Taoyuan (TW); Cheng-Hsien Lin, Taoyuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 916 days.

(21) Appl. No.: 11/959,194

(22) Filed: Dec. 18, 2007

(65) Prior Publication Data
US 2009/0007421 A1    Jan. 8, 2009

(30) Foreign Application Priority Data
Jul. 6, 2007  (CN) .......................... 2007 1 0075831

(51) Int. Cl.
*H05K 3/02*  (2006.01)
(52) U.S. Cl. ................. 29/846; 29/825; 29/830; 29/852
(58) Field of Classification Search ............ 29/825, 29/830, 946, 852; 228/180.1
See application file for complete search history.

(56) References Cited

U.S. PATENT DOCUMENTS

| | | | | |
|---|---|---|---|---|
| 4,316,320 A | * | 2/1982 | Nogawa et al. ................. | 29/839 |
| 5,448,020 A | * | 9/1995 | Pendse ........................... | 174/250 |
| 5,477,612 A | * | 12/1995 | Roberts ............................ | 29/846 |
| 5,507,903 A | * | 4/1996 | Yamamori et al. ............. | 156/229 |
| 5,768,776 A | * | 6/1998 | Pendse ........................... | 29/852 |
| 6,808,866 B2 | * | 10/2004 | Huang et al. .................. | 430/313 |
| 7,754,623 B2 | * | 7/2010 | Hsu ................................ | 438/800 |

FOREIGN PATENT DOCUMENTS

TW    I230029    3/2005

* cited by examiner

*Primary Examiner* — Carl Arbes
(74) *Attorney, Agent, or Firm* — Altis Law Group, Inc.

(57) ABSTRACT

An exemplary method for manufacturing flexible printed circuit board is provided. A metal foil is supplied from a first feeding roller. The metal foil has a first surface and a second surface on two opposite sides of the metal foil. A first coverlay having a number of first openings defined therein is supplied from a second feeding roller and laminated on the first surface of the metal foil. Electrical traces are formed with the metal foil. A second coverlay having a number of second openings defined therein is supplied from a third feeding roller and laminated on the second surface of the metal foil. Each of the second openings registers with the respective first opening so that the electrical traces are exposed from the corresponding first and second openings. The method can improve quality and efficiency of manufacturing flexible printed circuit boards in a hollowed out form.

13 Claims, 7 Drawing Sheets

METHOD FOR MANUFACTURING FLEXIBLE PRINTED CIRCUIT BOARDS

BACKGROUND

1. Technical Field

The present invention relates to flexible printed circuit boards, and particularly to a method for manufacturing flexible printed circuit boards.

2. Description of Related Art

Nowadays, flexible printed circuit boards, especially flexible printed circuit boards in a hollowed out form, also called embossed boards or windows boards in the art, are widely used in electronic products. Referring to FIG. 7, a flexible printed circuit board 1 in a hollowed out form is shown. The flexible printed circuit board 1 includes a copper layer 3 and two coverlays 4 on two opposite sides of the copper layer 3. The flexible printed circuit board 1 has a hollowed out portion 2. At the hollowed out portion 2, electrical traces formed with the copper layer 3 are naked and two opposite sides of the copper layer 3 are exposed. Thus, the electrical traces at the hollowed out portion 2 is capable of conducting electrical connection at both sides, i.e., the exposed two opposite sides of the copper layer 3 is available for electrical connection.

Generally, flexible printed boards in a hollowed out form are manufactured using a typical laminating method. Firstly, a sheet of coverlay with an opening defined therein is laminated on a surface of a sheet of copper foil. Secondly, electrical traces are formed with the copper foil in a series of processes including coating photoresist layer, exposing photoresist layer, developing photoresist layer and etching the copper foil. Thirdly, another sheet of coverlay with an opening defined therein is laminated on an opposite surface of the copper foil so that the two openings of the two coverlays align with each other. Thus the electrical traces formed with the copper foil are naked and exposed from the two openings of the two coverlays.

However, the typical method for forming flexible printed boards in a hollowed out form described above has the following disadvantages. First, because the method manufactures flexible circuit boards sheet by sheet, only one flexible circuit board can be manufactured using the method describe above each time. Thus, efficiency of manufacturing flexible printed circuit boards in a hollowed out form is low. Second, precise alignment of the two openings in the two coverlays is difficult, and the two openings of the two coverlays may be offset. Therefore, precision of the electrical traces exposed is low and quality of the flexible printed circuit board is unsatisfactory.

What is needed, therefore, is a method for manufacturing flexible printed circuit boards to improve quality and efficiency of manufacturing flexible printed circuit boards in a hollowed out form.

SUMMARY

One present embodiment includes a method for manufacturing flexible printed circuit boards. In the method, a metal foil is supplied from a first feeding roller. The metal foil has a first surface and a second surface located on an opposite side of the metal foil to the first surface. A first coverlay having a number of first openings defined therein is supplied from a second feeding roller and laminated on the first surface of the metal foil. Electrical traces are formed with the metal foil. A second coverlay having a number of second openings defined therein is supplied from a third feeding roller and laminated on the second surface of the metal foil. Each of the second openings registers with the respective first opening so that the electrical traces are exposed from the corresponding first and second openings.

BRIEF DESCRIPTION OF THE DRAWINGS

Many aspects of the present method for manufacturing flexible printed circuit boards can be better understood with reference to the following drawings. The components in the drawings are not necessarily drawn to scale, the emphasis instead being placed upon clearly illustrating the principles of the present method. Moreover, in the drawings, like reference numerals designate corresponding parts throughout the several views.

DETAILED DESCRIPTION OF THE EMBODIMENTS

An embodiment will now be described in detail below and with reference to the drawings.

Figure 1:
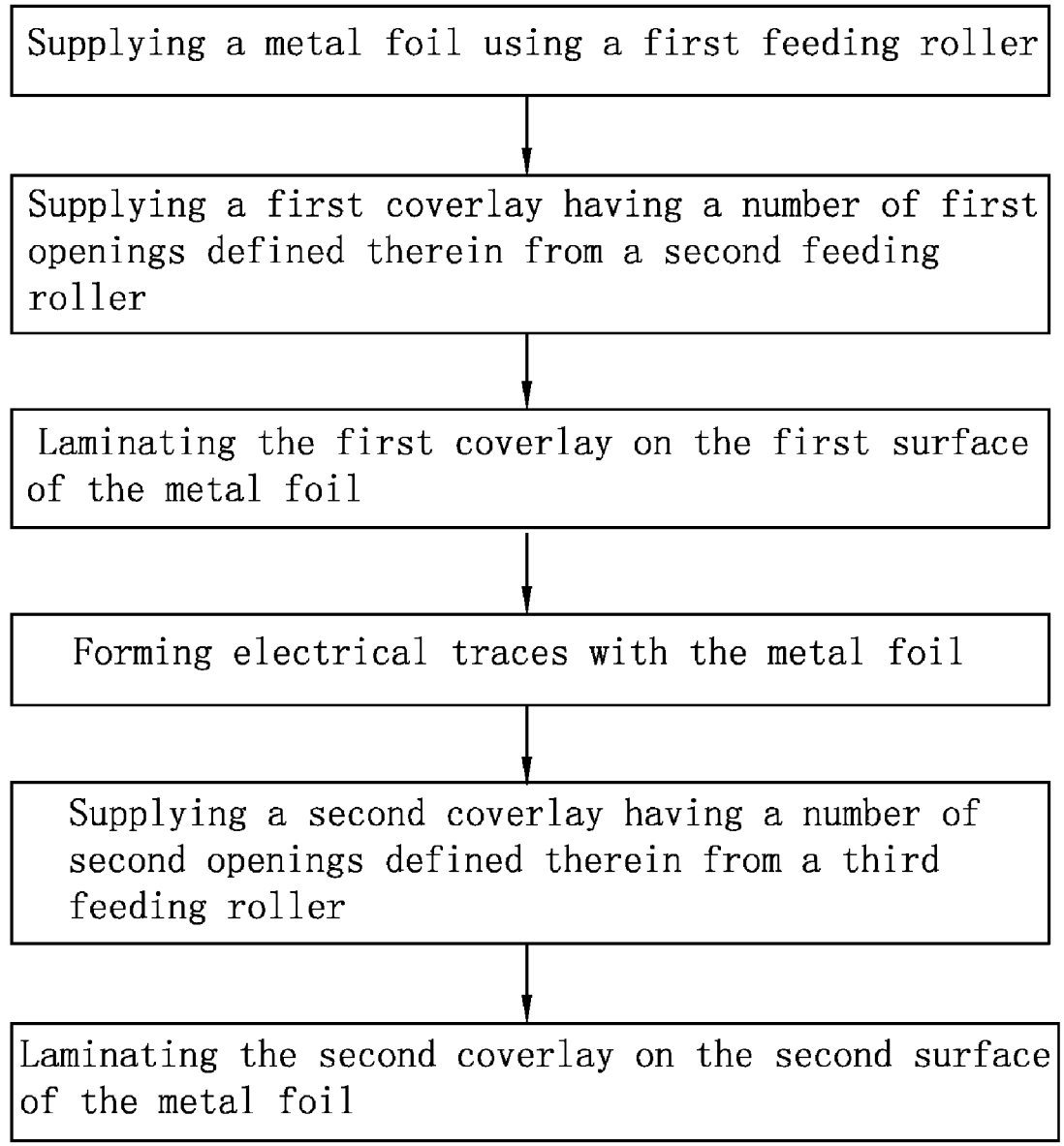
FIG. 1 is a flow chart of a method for manufacturing flexible printed circuit boards according to a present embodiment.
Figure 2:
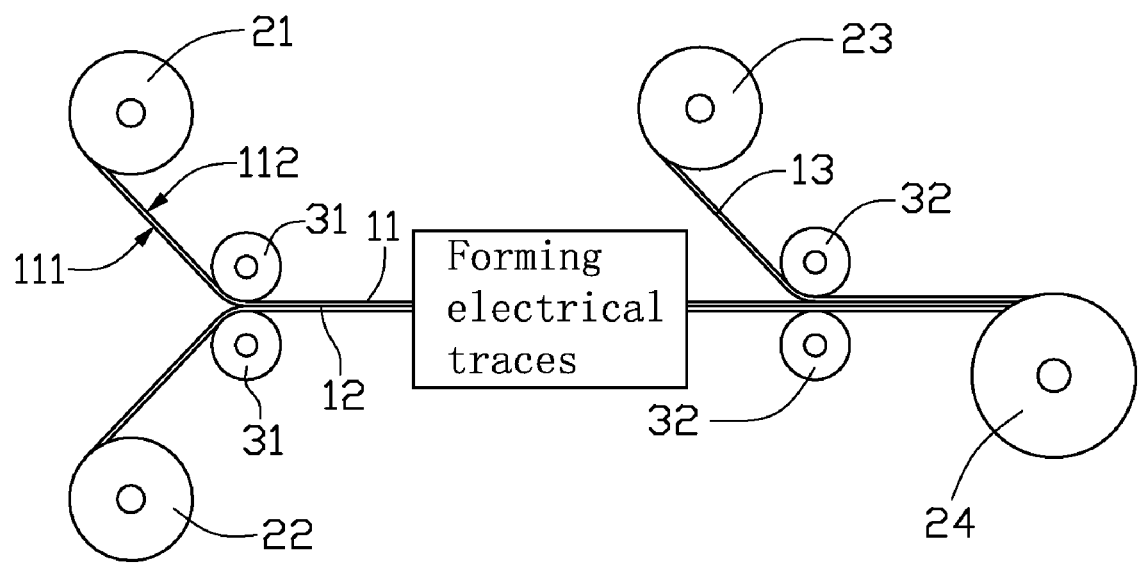
FIG. 2 is a schematic view of a method for manufacturing flexible printed circuit boards according to the present embodiment.

Referring to FIG. 1 and FIG. 2, a method for manufacturing multiple flexible printed circuit boards using a roll-to-roll process includes the following steps.

Step 1: a metal foil 11 is supplied from a first feeding roller 21.

Generally, in a mass producing process, a large sheet of raw metal foil is divided into a number of elongate tape-shaped metal foils 11 according to sizes of flexible printed circuit boards to be manufactured. The metal foil 11 has a first surface 111 and a second surface 112 located on an opposite side of the metal foil 11 to the first surface 111. In the present embodiment, the metal foil 11 is a copper foil. The copper foil can be either a rolled annealed (RA) copper foil or an electrodeposited (ED) copper foil. A thickness of the copper foil is in a range from 5 micrometers to 50 micrometers.

Figure 3:
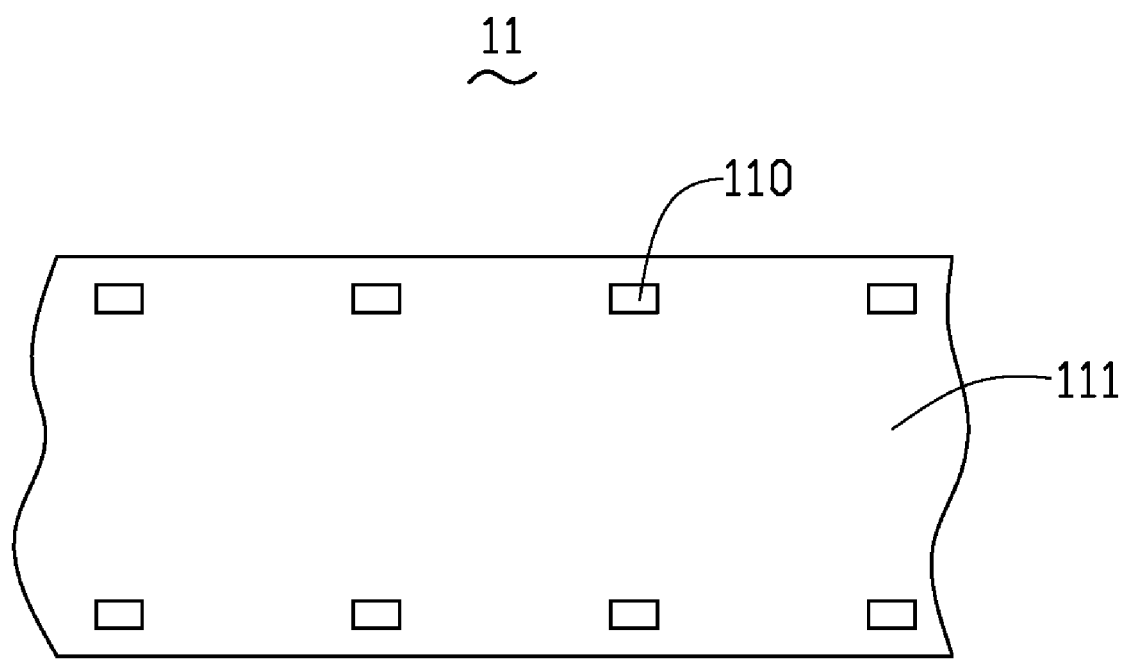
FIG. 3 is a schematic view of a metal foil for manufacturing flexible printed circuit boards according to the present embodiment.

Referring to FIG. 3, the metal foil 11 defines a number of first sprocket holes 110. The first sprocket holes 110 align in two opposite fringes of the tape-shaped metal foil 11 along a lengthwise extending direction of the tape-shaped metal foil 11. The metal foil 11 can be wrapped around the first feeding roller 21 via the first sprocket holes 110 and can also be unwrapped from the first feeding roller 21 to be laminated with other layers.

Step 2: a first coverlay 12 having a number of first openings 121 defined therein is supplied from a second feeding roller 22.

Figure 4:
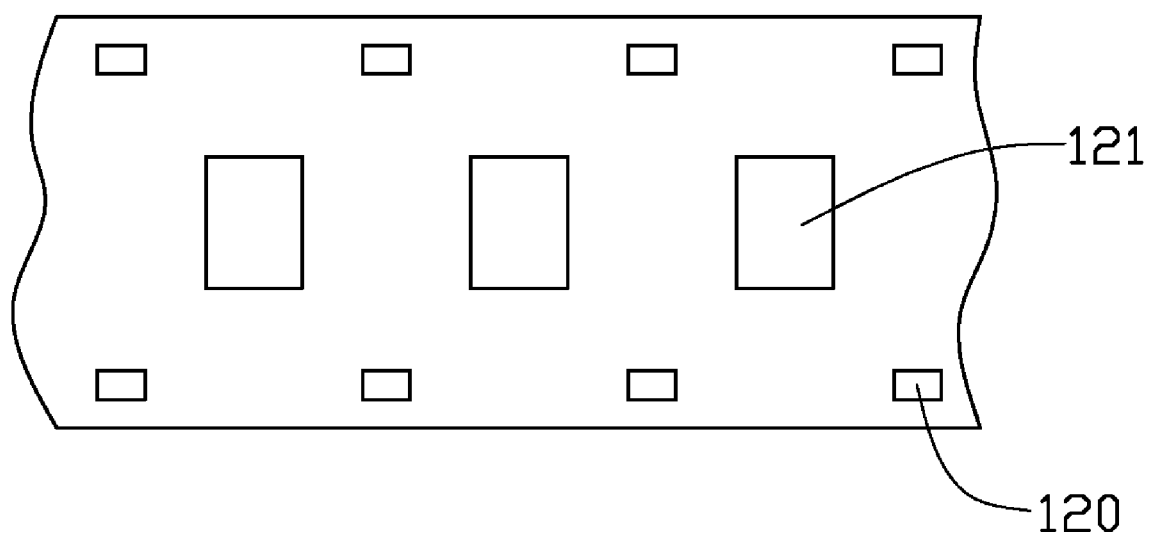
FIG. 4 is a schematic view of a first coverlay for manufacturing flexible printed circuit boards according to the present embodiment.

Generally, in a mass production process, a large sheet of raw coverlay is divided into a number of tape-shaped coverlays 12 according to sizes of the metal foil 11 or flexible printed circuit boards to be manufactured. Referring to FIG. 4, the first coverlay 12 has a number of first openings 121 defined in a center portion thereof. Each first opening 121 corresponds to a predetermined portion of the metal foil 11. Electrical traces formed with the predetermined portion of the metal foil 11 are available for electrical connection. In the present embodiment, the first openings 121 defined in the center portion of the first coverlay 12 is aligned along a lengthwise direction of the tape-shaped first coverlay 12. Each of the first openings 121 may have an identical configuration. Each of the first openings 121 corresponds to a flexible circuit board unit. It is noted that the configuration, sizes, numbers of the first openings 121 corresponding to the flexible circuit board unit can be altered/designed according to practical demand.

Furthermore, the first coverlay 12 defines a number of second sprocket holes 120 at two sides of the first openings 121. The second sprocket holes 120 align in two opposite fringes of the tape-shaped first coverlay 12 along a lengthwise extending direction of the tape-shaped first coverlay 12. The first coverlay 12 can be wrapped around the second feeding roller 22 via the second sprocket holes 120. The first coverlay 12 wrapped around the second feeding roller 22 can be unwrapped from the second feeding roller 22 to be laminated with other layers. The second sprocket holes 120 of the first coverlay 12 correspond to the first sprocket holes 110 of the metal foil 11 so as to register the first openings 121 with the corresponding predetermined portion of the metal foil 11 precisely.

The first coverlay 12 can be comprised of a material selected from a group consisting of polyimide (PI), polyethylene terephalate (PET), polyethylene naphthalate (PEN). A thickness of the first coverlay 12 is in a range from 10 micrometers to 75 micrometers.

Step 3: the first coverlay 12 is laminated on the first surface 111 of the metal foil 11.

Referring to FIG. 2, the first coverlay 12 is laminated with the metal foil 11. The first coverlay 12 and the metal foil 11 can be conveyed to a first laminating device 31. The first coverlay 12 is laminated onto the first surface 111 of the metal foil 11 using the first laminating device 31. The first openings 121 of the first coverlay 12 is located on the corresponding predetermined portion of the metal foil 11 by registering the first sprocket holes 110 with the second sprocket holes 120. Thus, the first openings 121 of the first coverlay 12 can be registered with the corresponding predetermined portion of the metal foil 11 precisely and successively.

The metal foil 11 especially the copper foil in the present embodiment exposed to ambient air may be oxidized and contaminated. Therefore, a surface treatment step is performed after the metal foil 11 is unwrapped from the first feeding roller 21 and before the metal foil 11 is laminated with the first coverlay 12. Oxidation and contamination on the first surface 111 of the metal foil 11 can be removed by washing in acid or washing in other solvents. After the surface treatment, surface roughness of the first surface 111 increases, thereby improving adhesion between the first coverlay 12 and the first surface 111.

Step 4: electrical traces are formed with the metal foil 11.

It is understood, the metal foil 11 laminated with the first coverlay 12 can be used as a substrate to make electrical traces. Because the second surface 112 of the metal foil 11 is still exposed to ambient air, the second surface 112 may be oxidized or/and contaminated. In order to prevent the oxidization and contamination, a surface treatment step is advantageously performed after the metal foil 11 is laminated with the first coverlay 12 and before making the electrical traces. Specifically, oxidation and contamination on the second surface 112 of the metal foil 11 can be removed by washing in acid or washing in other solvent. After the surface treatment, precision of electrical traces can be increased, thereby improving quality of the flexible printed circuit boards.

The electrical traces can be formed with the metal foil 11 using a photolithographic process or a laser ablation process. For illustration purpose only, in the present embodiment, the electrical traces are made using a photolithographic process. The photolithographic process includes the following steps.

Firstly, photoresist layers, such as a liquid photoresist layer and a dry film photoresist layer, are applied onto the second surface 112 and onto portions of the first surface 111 exposed from the first openings 121, respectively. The photoresist layer applied onto portions of the first surface 111 is configured for protecting the metal foil 11 from etching in the sequent etching step. However, the photoresist layer applied onto the second surface 112 will be exposed and developed so that an etching reaction can occur on the second surface 112 of the metal foil 11 to make the electrical traces in the sequent etching step.

In the present embodiment, dry film photoresist layers are applied onto the second surface 112 and onto portions of the first surface 111 exposed from the first openings 121, respectively. It is noted that, the first sprocket holes 110 and the second sprocket holes 120 may be covered by the dry film photoresist layers in this step, which would render the substrate composed of the metal foil 11 and the first coverlay 12 cannot be rewrapped around the feeding rollers to perform the sequent steps. Therefore, advantageously the dry film photoresist layers define a number of sprocket holes corresponding to the first sprocket holes 110 and the second sprocket holes 120 therein, so as to expose the first sprocket holes 110 and the second sprocket holes 120 from the dry film photoresist layers. The sprocket holes of the dry film photoresist layers can be defined before or after laminating the dry film photoresist layers onto the second surface 112 and onto portions of the first surface 111 exposed through the first openings 121. It is also noted that the dry film photoresist layers can be provided from an additional feeding roller successively to laminate onto the second surface 112 and portions of the first surface 111 exposed from the first openings 121.

Additionally, if one dry film photoresist layer is directly laminated onto the portions of the first surface 111 exposed from the first openings 121, the one dry film photoresist layer may not adhere onto the first surface 111 due to the a thickness of the first coverlay 12. As such, it is advantageously to place a removable underlay, e.g., a removable lacquer onto and cover portions of the first surface 111 exposed from the first openings 121. A thickness of the removable underlay can be equal to that of the first coverlay 12. As a result, the removable underlay can avoid bubbles existing between the one dry film photoresist layer and the first surface 111.

Secondly, the photoresist layer applied onto the second surface 112 is exposed using a photo mask having a predetermined electrical traces pattern. The substrate composed of the metal foil 11 and the first coverlay 12 having the photoresist layer laminated thereon can be unwrapped according to a predetermined length. Because of the presence of the first sprocket holes 110 and the second sprocket holes 120, the substrate composed of the metal foil 11 and the first coverlay 12 can be continuously conveyed to an exposing apparatus to expose the predetermined portions.

Thirdly, a predetermined photoresist pattern corresponding to a predetermined electrical traces pattern of the photo mask is developed using a developing agent.

Fourthly, parts of the metal foil 11 uncovered by the photoresist layers are etched and removed with a metal etchant. Meanwhile, remained parts of the metal foil 11 protected by the photoresist layers are transformed into electrical traces. In the present embodiment, the metal etchant is a copper etchant that is capable of etching copper.

Finally, the residual photoresist layers coated on the second surface 112 and portions of the first surface 111 exposed from the first openings 121 are removed, thus the electrical traces are exposed. As an example, the residual photoresist layer can be removed using an alkali solution.

Advantageously, the above steps including applying photoresist layer, exposing photoresist layer, developing photoresist layer and removing residual photoresist layer can be performed successively in a roll to roll manner in an automation manufacturing process, i.e., the photolithographic process is performed successively in a roll to roll manner. Thus electrical traces for multiple flexible printed circuit boards are formed.

Step 5: a second coverlay 13 having a number of second openings 131 defined therein is supplied using a third feeding roller 23.

Figure 5:
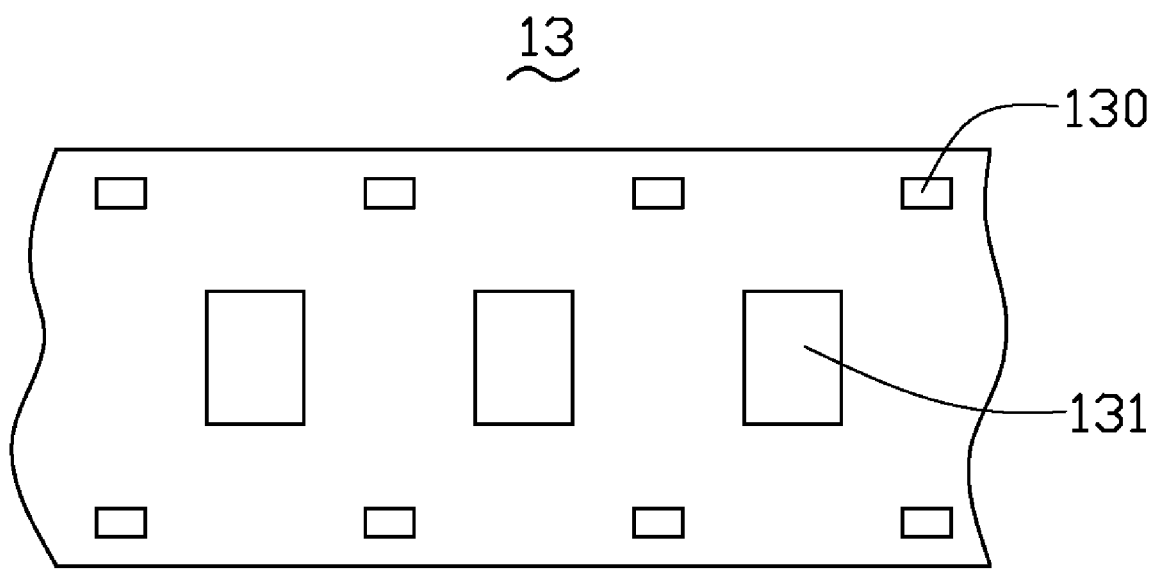
FIG. 5 is a schematic view of a second coverlay for manufacturing flexible printed circuit boards according to the present embodiment.

Generally, in a mass production process, a large sheet of raw coverlay can be divided into a number of elongate tape-shaped second coverlay 13 according to sizes of the metal foil 11 or flexible printed circuit boards manufactured. Referring to FIG. 5, the second coverlay 13 has a number of second openings 131 defined in a center portion thereof. Each of the second openings 131 corresponds to one of the first openings 121 of the first coverlay 12. In the present embodiment, the second openings 121 are defined in a center portion thereof and align along a lengthwise extending direction of the tape-shaped second coverlay 12 corresponding to the first openings 121.

Furthermore, the second coverlay 13 defines a number of third sprocket holes 130 at two sides of the second openings 131. The third sprocket holes 130 align in two opposite fringes of the tape-shaped second coverlay 13 along a lengthwise extending direction of the tape-shaped second coverlay 13. The second coverlay 13 can be wrapped around the third feeding roller 23 via the third sprocket holes 130. The second coverlay 13 wrapped around the second feeding roller 22 can be unwrapped from the third roller 22 to be laminated with other layers. The third sprocket holes 120 of the second coverlay 13 correspond to the first sprocket holes 110 of the metal foil 11 and the second sprocket holes 120 of the first coverlay 12 so as to register the second openings 131 with the first openings 121 and the predetermined portions of the metal foil 11 precisely.

The second coverlay 13 can be comprised of a material selected from a group consisting of polyimide (PI), polyethylene terephalate (PET), polyethylene naphthalate (PEN). A thickness of the second coverlay 13 is in a range from 10 micrometers to 75 micrometers.

Step 6: the second coverlay 13 is laminated on the second surface 112 of the metal foil 11. Each of the second openings 131 registers with the respective first opening 121 so that the electrical traces made in previous step can be exposed from the corresponding first openings 121 and the corresponding second openings 131.

Referring to FIG. 2, the second coverlay 13 is laminated with the metal foil 11. The second coverlay 13 and the substrate composed of the metal foil 11 and the first coverlay 12 having the electrical traces formed thereon can be conveyed to a second laminating device 32. The second coverlay 13 is laminated onto the second surface 112 of the metal foil 11 using the second laminating device 32. The second openings 131 of the second coverlay 13 locate on the predetermined portions of the metal foil 11 by registration of the third sprocket holes 130, the second sprocket holes 120 and the first sprocket holes 110, thus the second openings 131 of the second coverlay 13 can be registered with the first openings 121 and the predetermined portions of the metal foil 11 precisely and successively.

Figure 6:
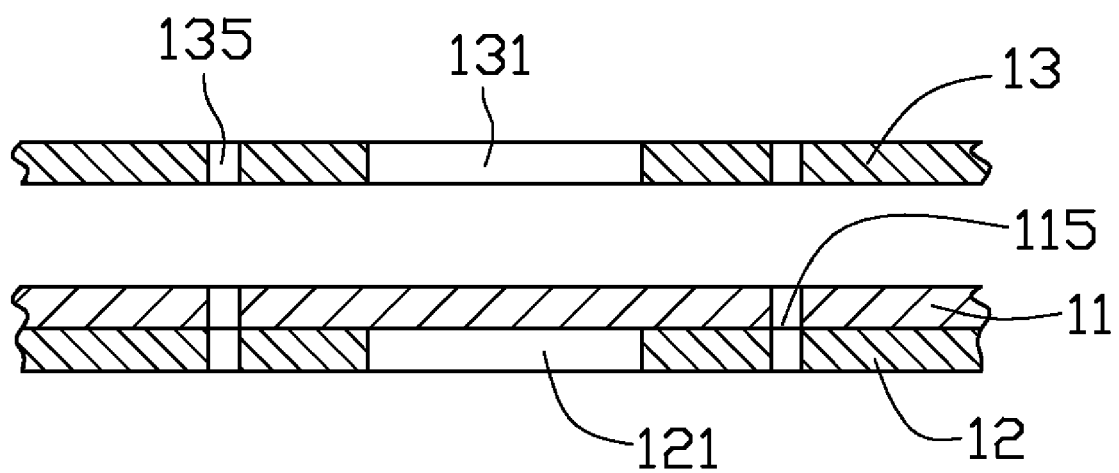
FIG. 6 is a schematic view of registering the first coverlay laminated onto the metal foil and the second coverlay via registration holes.
Figure 7:
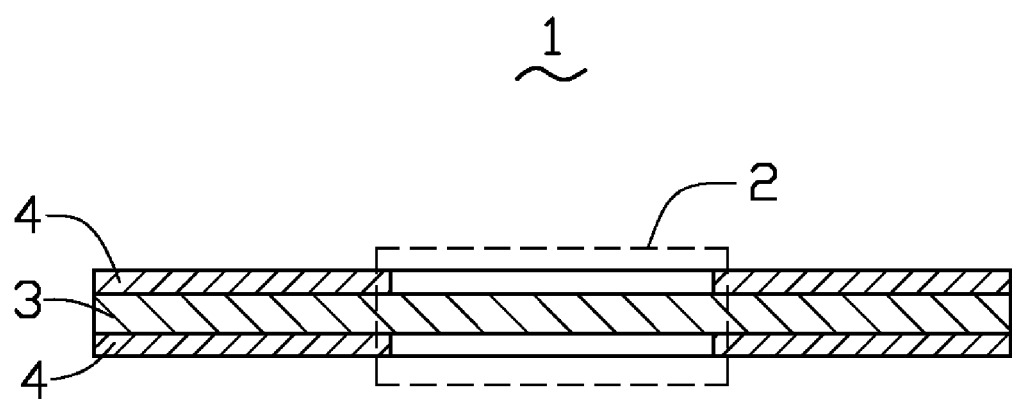
FIG. 7 is a schematic view of a typical flexible printed circuit board in a hollowed out form.

Preferably, a drilling holes step can be performed after the electrical traces are formed and before the second coverlay 13 is laminated. Referring to FIG. 6, a number of first registration holes 115 are formed in the substrate composed of the metal foil 11 and the first coverlay 12. A number of second registration holes 135 corresponding to the first registration holes 115 are formed in the second coverlay 13. The second openings 131 of the second coverlay 13 can be registered with the first openings 121 and the predetermined portions of the metal foil 11 precisely by registration of the first registration holes 115 and the second registration holes 135.

After the metal foil 11 laminates with the first coverlay 12 and the second coverlay 13 thereon, the following steps including printing legend, attaching stiffer, electroplating gold, and printing solder resist can be performed selectively using the roll to roll process. Thus, multiple flexible printed circuit boards in tape-shaped can be obtained and wrapped around a fourth feeding roller 24. Then, multiple flexible printed circuit boards can be separated into multiple individual flexible printed circuit boards in a hollowed out form.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A method for manufacturing flexible printed circuit boards, comprising:
   supplying a metal foil using a first feeding roller, the metal foil having a first surface and a second surface located on an opposite side of the metal foil to the first surface;
   supplying a first coverlay having a plurality of first openings defined therein from a second feeding roller;
   laminating the first coverlay on the first surface of the metal foil;
   forming electrical traces with the metal foil;
   supplying a second coverlay having a plurality of second openings defined therein from a third feeding roller; and
   laminating the second coverlay on the second surface of the metal foil, each of the second openings registering with the respective first opening so that the electrical traces are exposed from the corresponding first and second openings.

2. The method as claimed in claim 1, wherein the metal foil defines a plurality of first sprocket holes, the first coverlay defining a plurality of second sprocket holes, in the step of laminating the first coverlay on the first surface of the metal foil, the first openings registers with the corresponding predetermined portion of the metal foil by registration of the first sprocket holes and the second sprocket holes.

3. The method as claimed in claim 2, wherein the second coverlay defines a plurality of third sprocket holes corresponding to the first sprocket holes and the second sprocket holes, in the step of laminating the second coverlay on the second surface of the metal foil, the second openings registers with the corresponding first opening by registration of the third sprocket holes, the first sprocket holes and the second sprocket holes.

4. The method as claimed in claim 3, wherein after forming the electrical traces with the metal foil, a plurality of first registration holes are formed in a substrate composed of the metal foil and the first coverlay, a plurality of second registration holes corresponding to the first registration holes are formed in the second coverlay, in the step of laminating the second coverlay on the second surface of the metal foil, the second openings registers with the corresponding first opening by registration of the first registration holes and the second registration holes.

5. The method as claimed in claim 3, wherein the electrical traces is formed with the metal foil using a photolithographic process.

6. The method as claimed in claim 5, wherein in the photolithographic process photoresist layers are respectively applied onto the second surface and portions of the first surface exposed from the first openings.

7. The method as claimed in claim 5, wherein the photoresist layers are dry film photoresist layers.

8. The method as claimed in claim 7, wherein each dry film photoresist layer defines a plurality of sprocket holes corresponding to the first sprocket holes and the second sprocket holes therein.

9. The method as claimed in claim 7, wherein before the dry film photoresist layer is applied onto portions of the first surface exposed through the first openings, a removable underlayer is applied onto and cover portions of the first surface exposed from the first openings.

10. The method as claimed in claim 1, wherein the electrical traces is formed with the metal foil using a laser ablation process.

11. The method as claimed in claim 1, wherein the metal foil is a copper foil.

12. The method as claimed in claim 1, wherein before the first coverlay is laminated onto the first surface of the metal foil, a surface treatment step is performed to clean the first surface of the metal foil.

13. The method as claimed in claim 1, wherein the first coverlay and the second coverlay are comprised of a material selected from a group consisting of polyimide, polyethylene terephalate, polyethylene naphthalate.

* * * * *